United States Patent [19]

Hoffman

[11] Patent Number: 4,724,379
[45] Date of Patent: Feb. 9, 1988

[54] RELAY MULTIPLEXING FOR CIRCUIT TESTERS

[75] Inventor: Mark S. Hoffman, Newton Center, Mass.

[73] Assignee: Teradyne, Inc., Boston, Mass.

[21] Appl. No.: 67,159

[22] Filed: Jun. 26, 1987

Related U.S. Application Data

[63] Continuation of Ser. No. 589,373, Mar. 14, 1984.

[51] Int. Cl.$^4$ .................... G01R 31/02; G01R 31/28
[52] U.S. Cl. ............................ 324/73 R; 324/73 PC; 324/158 F; 371/20
[58] Field of Search ........... 324/73 R, 73 AT, 73 PC, 324/158 F; 371/15, 16, 20

[56] References Cited

PUBLICATIONS

Schraeder, M. W.; "Multiplexed Measuring ... "; EDN; May 12, 1982; pp. 187, 188 and 190.
Faran, J. J., Jr.; "Methods of Assignment ... "; 1982, IEEE Test Conference; May 1982; pp. 641–647.

Primary Examiner—Ernest F. Karlsen

[57] ABSTRACT

Relay multiplexer circuitry for making a limited number of test channels connectable to a large number of test pins through relays connected to selected test channel nodes and test pin nodes, each test pin node being connectable to a unique combination of test channel nodes within a group of pin nodes, channel nodes and relays, the number of pin nodes connectable to each channel node being substantially uniform within a group to efficiently use channels to reduce the possibility of conflict.

9 Claims, 6 Drawing Figures

RELAY MULTIPLEXING FOR CIRCUIT TESTERS

This application is a continuation of application Ser. No. 589,373, filed Mar. 14, 1984.

FIELD OF THE INVENTION

The invention relates to relay multiplexer circuitry for making channels of a tester connectable to a large number of nodes of a circuit board being tested.

BACKGROUND OF THE INVENTION

A printed circuit board (PCB) can be tested by using a tester to provide test signals to nodes of the board under test and analyzing the resulting conditions at the nodes. One method of testing, in-circuit testing, involves using test pins to contact the nodes of the board under test, providing signals to those nodes that affect the conditions at a given device on the board (typically the nodes connected to leads to the particular device), analyzing the resulting signals, thereafter testing another device on the board by providing signals to another set of nodes of the board under test, and so on. There typically are a limited number of test channels, owing to their expense, connected to a large number of test pins through a relay multiplexer wired to make each test pin connectable to one of two test channels through two relays. The relays are operated to connect a test channel to only one test pin at one time, and the total number of test channels and the total number of test pins are usually divided into groups.

In one such prior art relay multiplexer, each group has two test channels made connectable to all sixteen test pins in the group through thirty-two relays; thus, only two test pins of the group can be connected at one time without a conflict. In this multiplexer, each group has a unique set of two test channels.

The possibility of conflict can also be reduced by increasing the number of relays to increase the "depth", i.e., the number of test channels connectable to each test pin. In the extreme case, making each channel connectable to each pin, one could use all channels and any pins without conflict. The number of relays, however, would be the number of channels times the number of test pins, requiring, for example, 100,000 relays to make one hundred test channels connectable to one thousand test pins.

Before the conception of this invention, Joseph Wrinn conceived relay multiplexer circuitry that made each test pin connectable to a unique combination of test channels within a group to reduce the possibility of conflict. The unique combinations of channels associated with pins in a group could include every possible unique combination of channels for the given number of channels per pin (i.e., depth D) so that the number of pins P in a group was $P = C!/D!(C-D)!$, where C is the number of channels. There also could be less than this number of pins, in which case every possible unique combination for the given number of channels and the depth would not be used.

SUMMARY OF THE INVENTION

I have discovered that, when a group of test channel nodes, test pin nodes and relays of a relay multiplexer is to include less than every possible unique combination of channel nodes, by making the number of pin nodes connectable to each channel node substantially uniform in the group, the channels are used efficiently so as to reduce the possibility of conflict.

In preferred embodiments the number of pin nodes connectable to each channel node does not vary by more than one (most preferably the number of pin nodes per channel is the same); and the number of relays per channel is two.

DESCRIPTION OF THE PREFERRED EMBODIMENT

The structure and operation of the presently preferred embodiment of the invention will now be described after first briefly describing the drawings.

DRAWINGS

STRUCTURE

Figure 1:
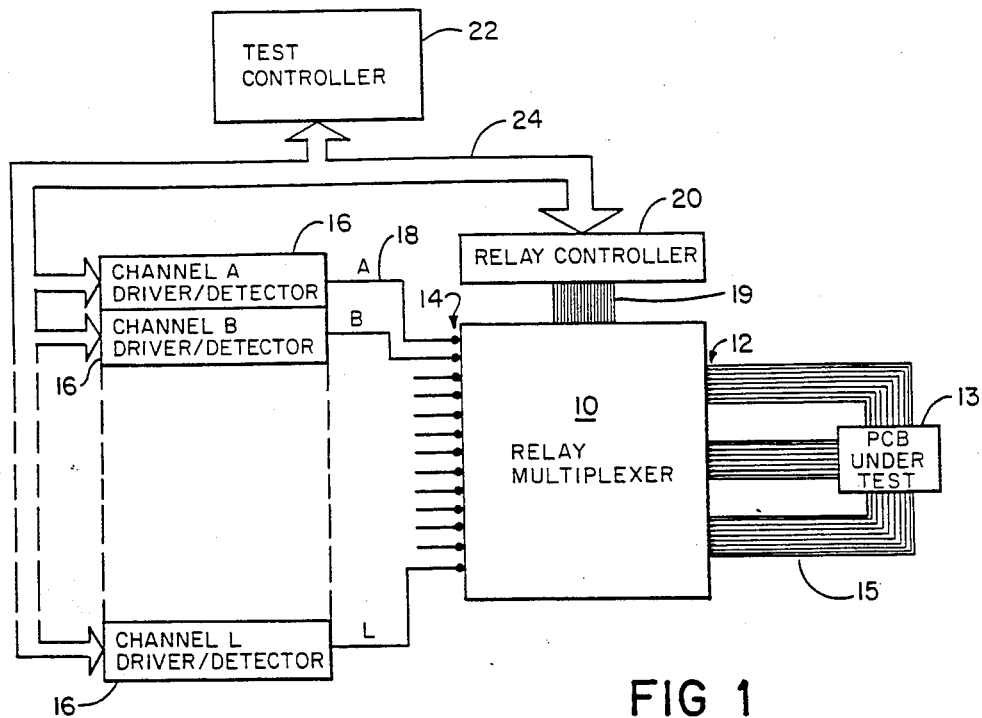
FIG. 1 is a functional block diagram showing relay multiplexer circuitry according to the invention connected to a PCB being tested and driver/detectors for tester channels.

Referring to FIG. 1, there is shown relay multiplexer 10 having 126 test pin nodes 12, connected to PCB under test 13 by 126 pin lines 15, and twelve test channel nodes 14, connected to twelve channel driver/detectors 16 for channels A to L via channel lines 18. Channel nodes 14 are connected to pin nodes 12 via relays in multiplexer 10 controlled by relay controller 20. Channel driver/detectors 16 and relay controller 20 are connected to test controller 22 by bus 24.

Figure 2:
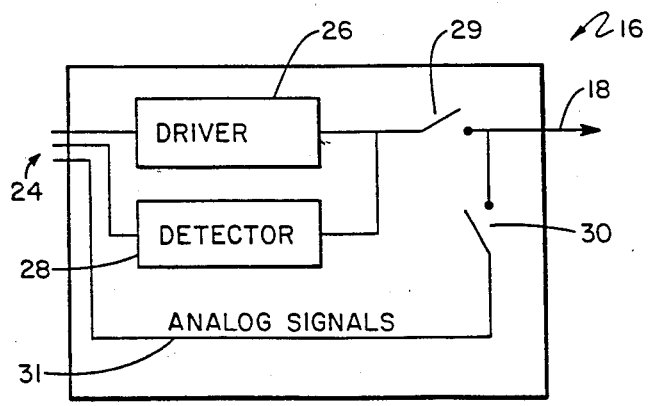
FIG. 2 is a functional block diagram of a channel driver/detector.

Referring to FIG. 2, there is shown a channel driver/detector 16. It includes driver 26 and detector 28 connected in parallel to switch 29 connected to channel line 18. It also includes switch 30 for connecting line 18 to analog signal line 31. Analog signal line 31, driver 26, and detector 28 are all connected to bus 24.

Figure 3:
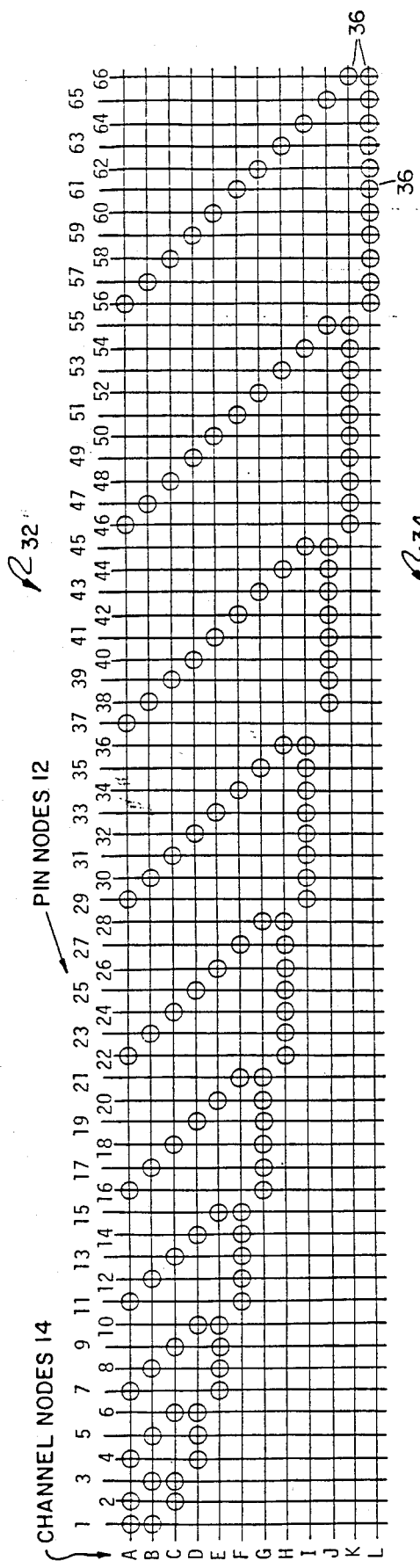
FIG. 3 is a schematic showing the wiring of the relays between channel nodes and pin nodes in said relay multiplexer circuitry.
Figure 4:
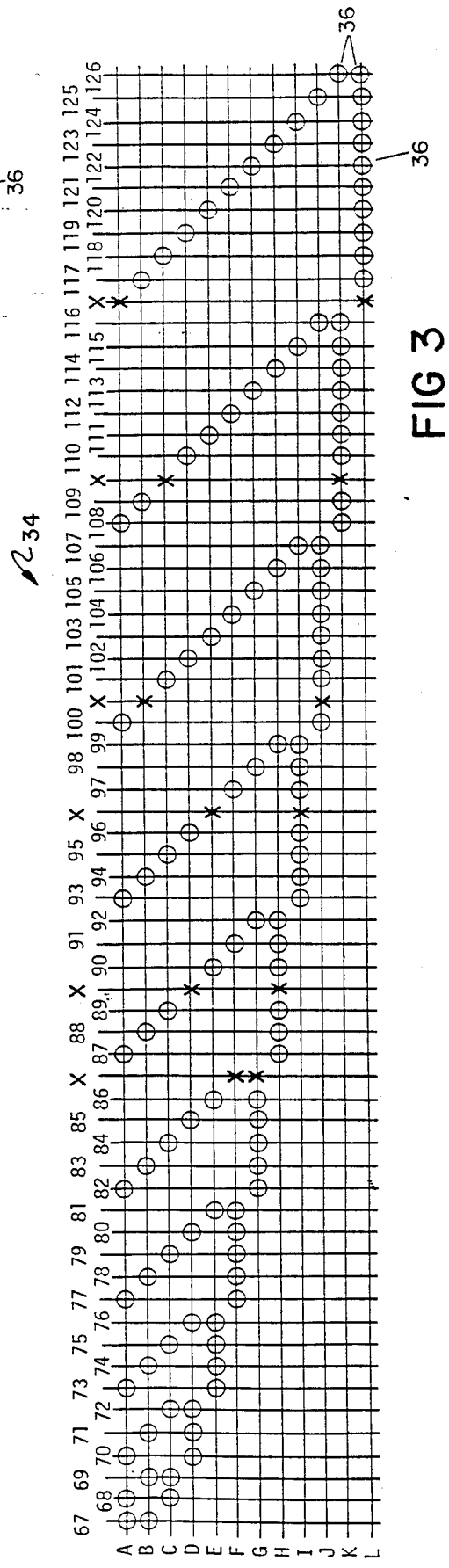
FIG. 4 is a schematic of a relay of said relay multiplexer circuitry.
Figure 4:
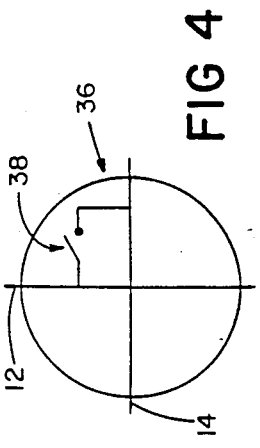

Referring to FIG. 3, showing the wiring of relay multiplexer 10, it is seen that there are two groups 32, 34 of pin nodes 12 and channel nodes 14. Group 32 includes test pin nodes numbered 1 to 66, and group 34 includes test pin nodes numbered 67 to 126. Within each group, each pin node 12 is connectable to a unique combination of two channel nodes 14 through two relays 36 (single form A relays). As is seen in FIG. 4, each relay 36 makes a channel node 14 connectable to a pin node 12 by a normally open switch 38 controlled by TTL signals from controller 20 (via means not shown). In group 32 or group 34 it is possible to make a connection between any pin node or any channel node of the group with any other pin node or channel node of the group, through multiple or single closed relays; in typical operation, however, at any given time, each channel node would be connected to no more than one pin node, and each pin node would be connected to no more than one channel node.

In group 32, the combinations of channel nodes 14 are assigned to pin nodes 12 in a fully combinatorial manner; i.e., every possible unique combination of two of the twelve channels A to L is shown in FIG. 3. Thus, the total number of pin nodes (sixty-six) equals $C!/D!(C-D)!$, where C equals the number of channels (twelve), and D equals the depth (two). In group 32 each channel is connectable to eleven test pin nodes.

The assignment of unique combinations of two channel nodes for the test pin nodes in group 34 is identical to that in group 32 except that group 34 does not have combinations corresponding to those for pin nodes numbered 21, 25, 33, 38, 48, 56. (Thus the combinations of channels are not fully combinatorial in group 34.) These six combinations have not been duplicated because only 126 (and not 132) pin nodes are being used in relay multiplexer 10. An X on the FIG. 3 schematic indicates the absence from group 34 of a combination that is used in group 32. These combinations were picked because each channel A to L is represented once, so that in group 34 there are ten pin nodes assigned to each of twelve channels A to L, instead of, e.g., nine pins assigned to one channel and eleven to another. This even distribution of pins per channel acts to reduce conflict, as does the requirement that each pin node in a group be connectable to a unique combination of channel nodes, as is discussed below.

Figure 5:
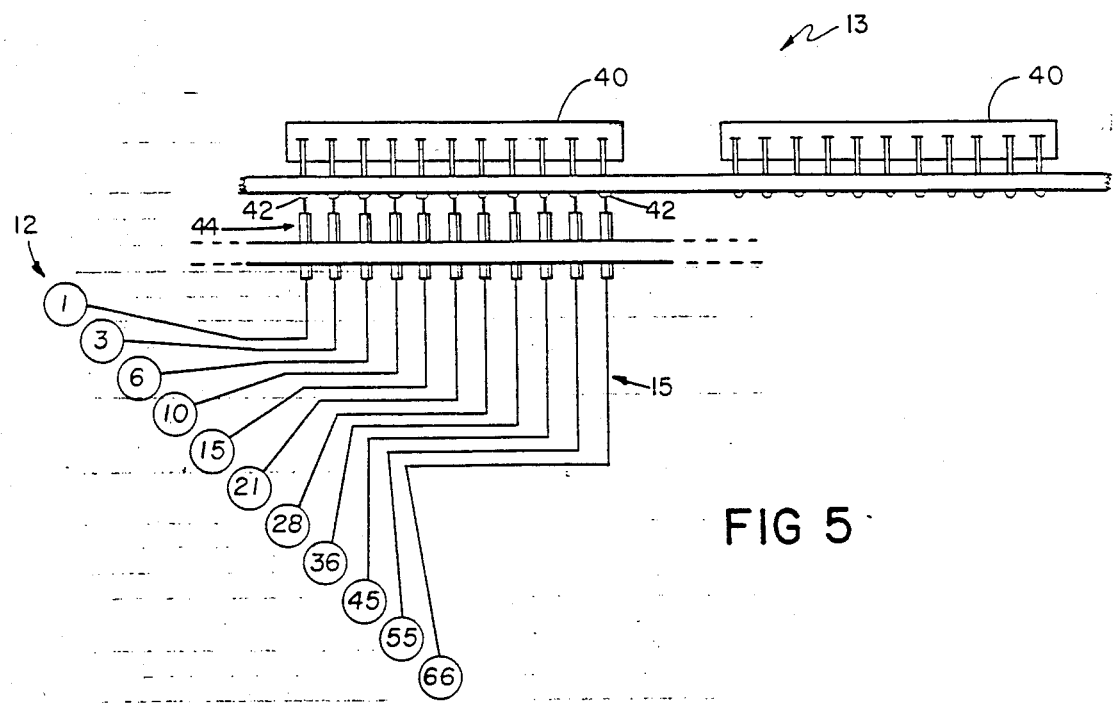
FIG. 5 is a diagrammatic elevation of a board under test contacted by test pins connected to specified pin nodes of said relay multiplexer circuitry.

Referring to FIG. 5, it is seen that PCB under test 14 includes a plurality of electronic devices 40. As is illustrated somewhat diagrammatically in FIG. 5 for a single device 40, nodes 42 at the leads to device 40 are contacted by spring-loaded test pins 44, connected to the indicated eleven pin nodes 12 (those numbered 1, 3, 6, 10, 15, 21, 28, 36, 45, 55, 66). As can be seen from FIG. 3, the indicated eleven pin nodes and another pin node 12, the one numbered 56, have been selected so that each channel has been used no more than twice; thus all channels can be used to test device 40 without conflict.

OPERATION

In operation, if PCB under test 13 has more devices 40 and nodes 42 than can be driven by the twelve channels A to L and 126 test pins connected to relay multiplexer 10, additional groups of twelve channel driver/detectors 16, relay multiplexers 10 and relay controllers 20, are provided and connected to test controller 22 over bus 24.

Test pins 44 are mounted on a support in position to contact all nodes 42 of PCB under test 13. In wiring test pins 44 to pin nodes 12, the pin nodes are assigned so that each channel is used no more than twice in the combinations of channels associated with the pin nodes connected to a single device 40. One pin node that is assigned to a device 40 is not initially wired but is reserved.

Figure 6:
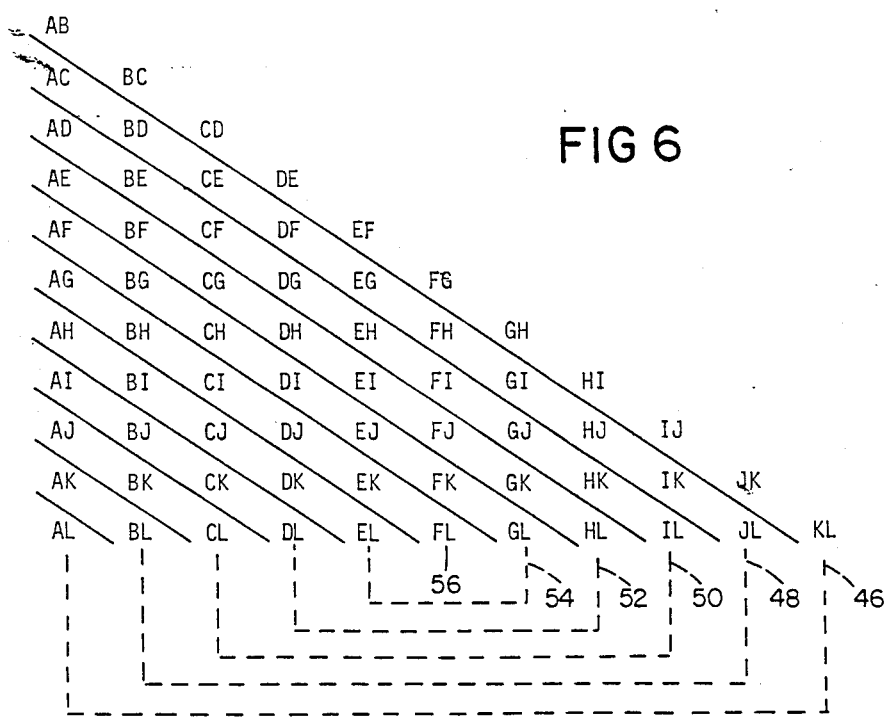
FIG. 6 is a diagram showing a method of assigning channel combinations to test pins and devices under test.

The diagram of combinations in FIG. 6 can be used to assign pin nodes. For example, in assigning pin nodes to the test pins 44 shown wired in FIG. 5, one picks channel combination group 46 to obtain combinations such that each channel is used only twice, and refers to FIG. 3 to identify the numbers of the corresponding pin nodes having these combinations. One combination of group 46 that is not used is the combination of channels A and L, the combination for the pin node numbered 56. By using only eleven pins in a channel combination group, any channel can be freed for use by any remaining pin to accommodate, without conflict, subsequent engineering change orders that might affect nodes 42 and require providing another test pin to a device 40.

In wiring further pin nodes 12 to test pins 44 for further devices 40, the test pin nodes associated with channel combination groups 48 to 54 (FIG. 6) can be used to identify pin nodes so that for each device 40, each channel is used no more than twice.

In making these test pin to pin node wiring connections, the possibility of conflict (i.e, of a channel having to be connected to more than one test pin at the same time) is smaller than with prior relay multiplexers having comparable numbers of channels and relays, because pin nodes 12 within group 32 or 34 are connectable to unique combinations of channel nodes 14. There is less chance that both channels for a pin node 12 will have to be used by other pin nodes than there would be, for example, if sixteen pin nodes 12 were all connectable to the same two channel nodes 14.

The various devices 40 on PCB under test 13 are tested by providing inputs to test pins 44 contacting those nodes 42 on board 13 that are electrically common to leads of a given device 40 on the board, while other devices 40 on the board are disabled by providing the appropriate signals, and sensing the resulting conditions at the nodes common to leads to the device 40 being tested. In testing individual devices 40, selected channels A–L are connected to selected test pins 44 by activating the appropriate relays 36 by relay controller 20, operating under relay control signals provided by controller 22 over bus 24. Test controller 22 also provides test control signals over bus 24 to operate channel drivers 26 to provide test signal inputs and detectors 28 to detect the test outputs while switch 29 is closed and switch 30 is open. When switch 30 is closed, analog signals are provided to test pins 44. The test outputs are provided to test controller 22, and compared with expected test outputs. After one device 40 has been tested, another device 40 on the board is tested by activating another set of test pins 44 and so on.

OTHER EMBODIMENTS

Other embodiments of the invention are within the scope of the following claims. For example, if less than sixty pins are to be used in group 34, additional channel combinations are picked so that the number of pins per channel for each channel is uniform. For example, if between seven and twelve of the sixty-six total possible combinations would not be used (i.e., if it was desired to have between fifty-four and fifty-nine pins), each channel would be represented no more than twice in the combinations removed from the fully combinatorial set shown in group 32. (In this case the pins per channel for each channel would be either ten or eleven.) If between thirteen and eighteen of the sixty-six total would not be used, each channel would be represented no more than three times in the combinations removed from the fully combinatorial set (in this case the pins per channel would be either nine or ten), and so on. This substantial uniformity of pins assigned to each channel results in efficient use of the channels and relays to avoid conflict; e.g., if one merely used pin nodes numbered 1 to 60, channel L would only be connectable to five pins, while the other channels would be connectable to eleven or ten pins, an inefficient use of channel L. While in some instances the pins per channel for each channel could vary by more than one and still be acceptable, preferably the pins per channel for each channel of a group should vary by no more than one, and most preferably the number should be the same for all channels.

The FIG. 6 diagram can be used to identify channel combinations to be deleted from the fully combinatorial set. In FIG. 6, the sixty-six unique channel combinations for twelve channels A–L and a depth of two are divided into five groups 46 to 54 of twelve channel combinations and one group 56 of six channel combinations. In group 56 each channel is represented once, and in each of groups 46 to 54 each channel is represented twice. Thus, if one were to use between sixty and sixty-five pins, the channel combinations of group 56 could be selected for deletion. (The six combinations not used in group 34 are different from but equivalent to those in group 56.) If one were to use between fifty-four and fifty-nine pins, the combinations of any one of groups 46 to 54 could be selected for deletion. If one were to use between forty-eight and fifty-three pins, the combinations of group 56 and any one of groups 46 to 54 could be selected for deletion, and so on.

Also, when using a second group to add pins for connection to channels already in a first group having a fully combinatorial set of channel combinations, one could assign channels to the new pins so that the number of pins per channel in the second group is substantially uniform. In this way the overall pins per channel values would be substantially uniform, providing efficient use of channels and promoting reduced chance of conflict.

Also, the principles described herein can be applied to depths larger than two and other numbers of channels in a group.

OTHER INVENTIONS

Subject matter related to using unique combinations of channels and making connections to test pins for specific devices on a board under test was the invention of Joseph F. Wrinn, whose U.S. patent application entitled "Relay Multiplexing for Circuit Testers" is being filed simultaneously with the present application.

What is claimed is:

1. Relay multiplexer circuitry for selectively connecting channels of a tester to selected test pins electrically connected to nodes of a circuit under test, said pins being larger in number than said channels, said circuitry comprising
    channel nodes connected to said channels,
    pin nodes connected to said pins, and
    relays wired for selectively making at least some of said pin nodes connectable to at least two said channels each so as to connect a said pin node to a said channel node when said relay is closed and not connect a said pin node to a said channel when said relay is open,
    at least some of said pin nodes, channel nodes and relays being wired so as to be organized in a group such that each said pin node of said group is connectable through single said relays to a unique combination of said channel nodes within said group and is not connectable through single said relays to other said channel nodes within said group, the number of pin nodes P in said group being greater than the number of channel nodes C in said group,
    said unique combinations of channel nodes in said group including less than the fully combinatorial set of combinations,
    the number of pins connectable to each said channel in said group being substantially uniform to efficiently use the channels so as to reduce the possibility of conflict.

2. The circuitry of claim 1 wherein the number of pin nodes connectable to each channel node does not vary by more than one in said group.

3. The circuitry of claim 2 wherein the number of pin nodes connectable to each channel node is the same.

4. The circuitry of claim 1 wherein there are two channels per pin.

5. Relay multiplexer circuitry for selectively connecting channels of a tester to selected test pins electrically connected to nodes of a circuit under test, said pins being larger in number than said channels, said circuitry comprising
    channel nodes connected to said channels,
    pin nodes connected to said pins, and
    relays wires for selectively making at least some of said pin nodes connectable to at least two said channels each so as to connect a said pin node to a said channel node when said relay is closed and not connect a said pin node to a said channel node when said relay is open,
    at least some of said pin nodes, channel nodes and relays being wired so as to be organized in a first group such that each said pin node of said first group is connectable through single said relays to a unique combination of said channel nodes within said first group and is not connectable through single said relays to other said channel nodes within said group, the number of pin nodes P in said first group being greater than the number of channel nodes C in said first group.
    at least some of said pin nodes, channel nodes and relays being organized in a second group, the number of pins connectable to each said channel in said second group being substantially uniform to efficiently use the channels so as to reduce the possibility of conflict.

6. The circuitry of claim 5 wherein said unique combinations of channel nodes in said first group are fully combinatorial.

7. The circuitry of claim 6 wherein the number of pin nodes of said second group connectable to each channel node of said second group does not vary by more than one in said second group.

8. The circuitry of claim 7 wherein the number of pin nodes of said second group connectable to each channel node of said second group is the same.

9. The circuitry of claim 5 wherein there are two channels per pin.

* * * * *